(12) United States Patent
Ye et al.

(45) Date of Patent: Nov. 28, 2023
(10) Patent No.: US 11,831,307 B2

(54) POWER SWITCH DRIVE CIRCUIT AND DEVICE

(71) Applicant: InventChip Technology Co., Ltd., Shanghai (CN)

(72) Inventors: Zhong Ye, Plano, TX (US); Danyang Zhu, Cary, NC (US)

(73) Assignee: InventChip Technology Co., Ltd., Shanghai (CN)

( * ) Notice: Subject to any disclaimer, the term of this patent is extended or adjusted under 35 U.S.C. 154(b) by 1 day.

(21) Appl. No.: 17/659,854

(22) Filed: Apr. 20, 2022

(65) Prior Publication Data

US 2022/0247404 A1   Aug. 4, 2022

Related U.S. Application Data

(63) Continuation-in-part of application No. 17/516,364, filed on Nov. 1, 2021, now Pat. No. 11,611,339, which is a continuation of application No. 17/069,113, filed on Oct. 13, 2020, now Pat. No. 11,165,423, which is a continuation of application No. PCT/CN2019/070648, filed on Jan. 7, 2019.

(30) Foreign Application Priority Data

Aug. 8, 2018   (CN) .......................... 201810896181.9

(51) Int. Cl.
| | |
|---|---|
| *H03K 3/00* | (2006.01) |
| *H03K 17/08* | (2006.01) |
| *H03K 19/00* | (2006.01) |
| *H03K 17/567* | (2006.01) |
| *H03K 17/0812* | (2006.01) |

(52) U.S. Cl.
CPC ..... *H03K 17/567* (2013.01); *H03K 17/08122* (2013.01)

(58) Field of Classification Search
None
See application file for complete search history.

(56) References Cited

U.S. PATENT DOCUMENTS

| | | | | |
|---|---|---|---|---|
| 7,233,191 | B2* | 6/2007 | Wang | H03K 17/04123 327/430 |
| 8,633,741 | B2* | 1/2014 | Spalding, Jr. | H03K 17/223 327/143 |
| 9,172,306 | B2 | 10/2015 | Clavette et al. | |
| 9,774,322 | B1 | 9/2017 | Duduman et al. | |
| 9,800,153 | B2* | 10/2017 | David | H02M 3/07 |

(Continued)

FOREIGN PATENT DOCUMENTS

| | | |
|---|---|---|
| CN | 102684462 A | 9/2012 |
| CN | 202424487 U | 9/2012 |

(Continued)

*Primary Examiner* — Kenneth B Wells
(74) *Attorney, Agent, or Firm* — AP3 Law Firm PLLC

(57) ABSTRACT

An apparatus includes a capacitor coupled to a gate of a power switch, and a negative voltage adjustment device connected to a common node of the capacitor and the gate of the power switch, wherein the negative voltage adjustment device is configured such that after a turn-off signal is applied to the gate of the power switch, a voltage across the capacitor is maintained at a predetermined voltage level through a negative current provided by the negative voltage adjustment device.

19 Claims, 13 Drawing Sheets

(56) References Cited

U.S. PATENT DOCUMENTS

| | | | |
|---|---|---|---|
| 9,800,245 B2 | 10/2017 | Dighrasker et al. | |
| 10,270,440 B2 * | 4/2019 | Ptacek | H03K 19/00361 |
| 10,432,175 B2 * | 10/2019 | Choi | H02M 1/08 |
| 10,868,521 B2 * | 12/2020 | Choi | H02M 1/08 |

FOREIGN PATENT DOCUMENTS

| | | |
|---|---|---|
| CN | 203313043 U | 11/2013 |
| CN | 203406774 U | 1/2014 |
| CN | 104506028 A | 4/2015 |
| CN | 108539964 A | 9/2018 |
| JP | 2014027345 A | 2/2014 |

* cited by examiner

POWER SWITCH DRIVE CIRCUIT AND DEVICE

CROSS-REFERENCE TO RELATED APPLICATIONS

This application is a continuation-in-part of U.S. patent application Ser. No. 17/516,364, filed Nov. 1, 2021, now U.S. Pat. No. 11,611,339 issued Mar. 21, 2023, which is a continuation application of U.S. patent application Ser. No. 17/069,113, filed on Oct. 13, 2020, now U.S. Pat. No. 11,165,423, issued Nov. 2, 2021, which is a continuation application of International Application No. PCT/CN2019/070648, filed on Jan. 7, 2019, which claims priority to Chinese Patent Application No. CN201810896181.9, filed on Aug. 8, 2018. The disclosures of the aforementioned applications are hereby incorporated herein by reference in their entireties.

TECHNICAL FIELD

The invention relates to the field of power semiconductor devices, in particular to a drive circuit and device of a power switch.

BACKGROUND

Power semiconductor drive circuits are mainly used for driving power semiconductor switching devices such as devices formed of silicon carbide, silicon, gallium nitride, etc. Power semiconductor drive circuits are widely used in the design of power converters. These power converters include AC/DC converters, DC/DC converters, and DC/AC converters. Terminal equipment that uses these power converters includes power supplies, motor drive equipment, solar energy conversion equipment, new energy vehicles, etc.

The structures of the existing drive circuits are shown in FIG. 1 (a)-(c). Among them, the drive circuit including field effect transistors (MOS) Q1 and Q2 receives an input pulse signal. After power and level amplification, the drive circuit generates a drive signal for controlling the on and off of the power switch Q3. Cn is a capacitor. Rg and Rc are Resistors. Dc is a diode. Dz is a Zener diode. VDD is a power supply voltage.

The circuit shown in FIG. 1(a) is the simplest solution to provide a negative voltage for the gate drive voltage Vg of Q3 when a turn-off signal is received. However, when the Pulse Width Modulation (PWM) signal is activated, the initial storage voltage of the capacitor (Cn) may be zero or lower than a predetermined voltage after the voltage of the capacitor has been discharged. In a certain period of time after the signal has been activated, this will cause the positive gate voltage to be too high, and the negative gate voltage to be insufficient (as shown in FIG. 2). Moreover, in this circuit, the capacitor can be charged only when the PWM signal (e.g., pulse signals) is a high-level signal. If the PWM signal (e.g., pulse signals) is in a low-level state (such as an idle state) for a long time, the capacitor cannot be replenished in time. The voltage of the capacitor may drop due to leakage or other interference factors. This may result in insufficient negative voltage on the gate, which is unable to maintain a reliable shutdown of the power switch before the power switch is switched on again, thus causing reliability issues of the power switch and its associated drive circuit. Especially for silicon carbide Metal-Oxide-Semiconductor Field-Effect Transistor (SiC MOSFET), it usually has a narrow positive gate voltage range and a lower gate threshold voltage.

The drive circuit shown in FIG. 1(b) uses an external simple circuit comprising Cn and Dz to generate a negative voltage. This circuit solves the startup problem in FIG. 1(a). However, this circuit requires a separate isolated bias voltage (e.g., voltage source+V). In this circuit, the simple bootstrap circuit cannot be used to power the high-side drive circuit of a half-bridge, which will add great complexity to the system, thereby increasing the cost of the circuit.

The drive circuit shown in FIG. 1(c) simplifies the entire circuit, but the circuit requires two isolated bias voltages (+V and -V) having positive and negative voltages to generate the negative bias required by the power switch. The isolated bias voltages can add a lot of complexity to the system.

Therefore, there is an urgent need to provide a simple, reliable, low pin count, but fully functional IC integrated circuit solution to realize the gate drive function of the power switch device.

SUMMARY OF THE INVENTION

The object of the present invention is to provide a drive circuit for a power switch. This drive circuit can maintain the capacitor voltage when the pulse signal is off for a long time. The drive circuit can provide a stable negative voltage for the power switch to maintain the turn off of the power switch.

In order to solve the technical problems above, the embodiments of the present invention disclose a drive circuit for a power switch. The input terminal of the drive circuit receives a pulse signal. The pulse signal includes a turn-on signal for controlling the power switch to be turned on and a turn-off signal for controlling the power switch to be turned off. The output terminal of the drive circuit is connected to a capacitor circuit. The capacitor circuit is used to provide a negative voltage for a first electrode of the power switch to turn off the power switch when the pulse signal is a turn-off signal.

The drive circuit includes a capacitance adjustment unit. The capacitance adjustment unit includes a negative voltage adjustment element that can charge a capacitor whose voltage is lower than a predetermined voltage when the pulse signal is the turn-off signal. The capacitor is included in the capacitor circuit.

In an exemplary embodiment, the negative voltage adjustment element includes a negative voltage charge pump, which is used to charge the capacitor whose voltage is lower than the predetermined voltage when the drive circuit receives the turn-off signal.

In an exemplary embodiment, the negative voltage charge pump is connected in parallel with the capacitor circuit, and the low voltage end of the capacitor is connected to the first electrode of the power switch.

In an exemplary embodiment, the capacitance adjusting unit further includes a positive voltage adjustment element, which is used to charge the capacitor whose voltage is lower than a predetermined voltage when the drive circuit receives a turn-on signal.

In an exemplary embodiment, the positive voltage adjustment element includes a first resistor and a diode connected in series.

The first terminal of the first resistor is connected to the low voltage end of the capacitor. The second terminal of the first resistor is connected to the anode of the diode. The cathode of the diode is connected to ground.

In an exemplary embodiment, the capacitance adjustment unit further includes an over-voltage adjustment element for clamping the voltage of the capacitor to a predetermined voltage when the voltage of the capacitor exceeds the predetermined voltage.

In an exemplary embodiment, the drive circuit further includes a charging unit for charging the capacitor with a current source in the charging unit when the drive circuit is started, and, When the charging unit charges the capacitor, the low voltage end of the capacitor and a second electrode of the power switch are both grounded.

In an exemplary embodiment, the charging unit further includes a first switch and a second switch.

The current source, the first switch, the capacitor circuit and the second switch are connected in series.

The first terminal of the second switch is connected to the low voltage end of the capacitor, and the second terminal of the second switch is grounded.

When the capacitor is charged, the current source, the first switch, the capacitor circuit and the second switch form a current path.

In another exemplary embodiment, the current source may be a voltage source with a current limiting function, and the output value of the voltage source is equal to the predetermined voltage of the capacitor.

In an exemplary embodiment, the drive circuit further includes a power amplifying unit and a control unit.

The power amplifying unit is used to amplify the pulse signal received by the drive circuit and output it.

The control unit is used for turning off the power switch through a clamping circuit when the power supply voltage is lower than a first predetermined voltage and/or the voltage of the capacitor is lower than a second predetermined voltage.

In an exemplary embodiment, the drive circuit satisfies at least one of the following conditions:

When the power switch is a bipolar transistor, the first electrode is the base, and the second electrode is the emitter; when the power switch is a field effect transistor, the first electrode is the gate, and the second electrode is the source.

The power switch is a silicon carbide, silicon or gallium nitride field effect transistor;

The over-voltage adjustment element includes a Zener diode.

The embodiment of the present invention also discloses a drive device for a power switch. The drive device includes the drive circuit disclosed above and a capacitor circuit connected to the output terminal of the drive circuit.

The embodiment of the present invention also discloses a drive device for a power switch. The drive device includes the drive circuit disclosed above, a capacitor circuit connected to the output terminal of the drive circuit, and a pulse circuit generating a pulse signal.

The embodiment of the present invention also discloses a drive device for a power switch, which includes a second resistor, a capacitor and a negative voltage charge pump.

The second resistor is connected in series with the capacitor. The high voltage end of the capacitor is connected to the first terminal of the second resistor, and the low voltage end of the capacitor is connected to the first electrode of the power switch and the first terminal of the negative voltage charge pump.

The second terminal of the second resistor is connected to the second terminal of the negative voltage charge pump, and the second terminal of the second resistor receives the pulse signal that controls the turning on and off of the power switch.

The second electrode of the power switch is grounded.

In an exemplary embodiment, the drive device further includes a current source, a first switch and a second switch.

The current source, the first switch, the second resistor, the capacitor and the second switch are connected in series.

The first terminal of the second switch is connected to the low voltage end of the capacitor, and the second terminal of the second switch is grounded.

When charging the capacitor, the first switch and the second switch transition from a turn-off state to a turn-on state. The current source, the first switch, the second resistor, the capacitor and the second switch form a current path.

Compared with the prior art, the main differences and effects of the embodiments of the present invention are:

Without additional power supplies, when the pulse signal is a turn-off signal for a long time (such as an idle time), it can promptly supplement the loss of stored power due to leakage of the capacitor, thereby providing a stable turn-off negative voltage for the power switch.

Furthermore, after the capacitor is charged to the required predetermined voltage, a low-power negative voltage charge pump can be used to charge the capacitor and keep it at the predetermined voltage, thereby saving the circuit area and reducing the circuit cost while maintaining the negative voltage for a long time.

Furthermore, when the drive module receives the turn-on signal, the first resistor and the diode can charge the capacitor when the capacitor voltage is lower than the predetermined voltage.

Furthermore, the capacitor can be quickly charged when the drive circuit is started or restarted, effectively avoiding the problems of excessively high positive voltage or insufficient negative voltage on the gate of the power switch. At the same time, grounding the first and second electrodes of the power switch simultaneously when the capacitor is charged can ensure that the power switch remains off during the charging period of the capacitor, thereby improving the capacitor charging efficiency while ensuring the reliability of the circuit.

Furthermore, the over-voltage adjustment element can clamp the voltage of the capacitor to a predetermined voltage to avoid overcharging.

Furthermore, when the power supply voltage is too low or the capacitor voltage is too low, the gate or base voltage of the power switch can be pulled down to zero volts through the Miller clamping pin to turn off the power switch and protect the circuit.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In the following description, many technical details are provided for the reader to better understand the application. However, those of ordinary skill in the art can understand that even without these technical details and various changes and modifications based on the following embodiments, the technical solutions required by the claims of this application can be implemented.

It can be understood that in the present invention, the low voltage end of the capacitor refers to the end of the capacitor with a lower voltage (such as the negative plate of the capacitor), and correspondingly, the high voltage end refers to the end with a higher voltage (such as the positive plate of the capacitor).

In addition, it can be understood that, in the present invention, the power switch may be various types of switches, which is not limited herein. Preferably, the power switch is a silicon carbide, silicon or gallium nitride field effect transistor. When the power switch is a bipolar transistor, the first electrode is the base and the second electrode is the emitter; when the power switch is a field effect transistor, the first electrode is the gate and the second electrode is the source.

In addition, it can be understood that the predetermined voltage in the present invention refers to the negative voltage charged in the capacitor for maintaining the power switch in the off state when the drive circuit is started or restarted. The capacitor of the present invention can be a single capacitor, or a capacitor circuit composed of multiple capacitors in parallel and/or in series. It is worth noting that the voltage of the capacitor of the present invention is much higher than the voltage of the parasitic capacitor between the gate and source (or base and emitter) of the power switch, such as more than ten times, so as to ensure that when the pulse signal is applied, the power switch is controlled to be turned off or on, and the negative voltage on the capacitor remains basically unchanged.

In addition, it can be understood that in the present invention, both PWM and pulse signals refer to pulse signals used to control the on and off of the power switch. This time, the pulse circuit that generates the pulse signal can be an analog controller or a digital controller.

In order to make the objectives, technical solutions and advantages of the present invention clearer, the embodiments of the present invention will be described in further detail below in conjunction with the accompanying drawings.

Figure 1A:
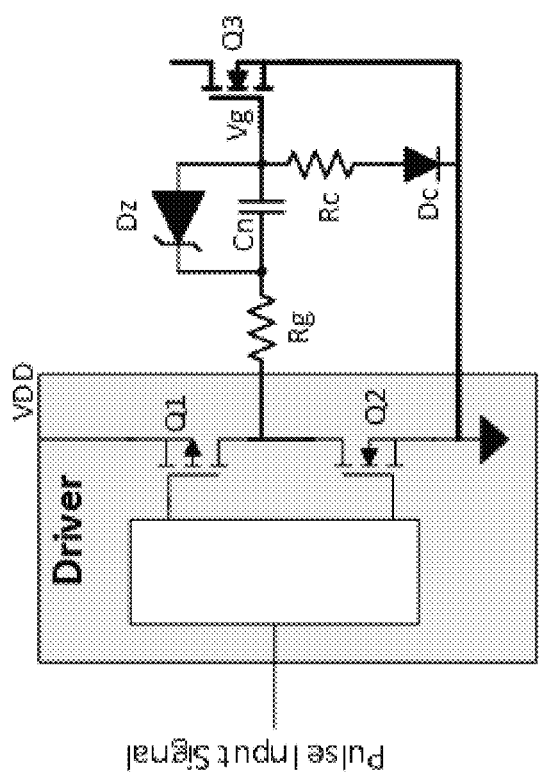
FIG. 1 (a)-(c) are schematic diagrams of the circuit structures of the drive circuits of the power switch in the prior art.
Figure 1B:
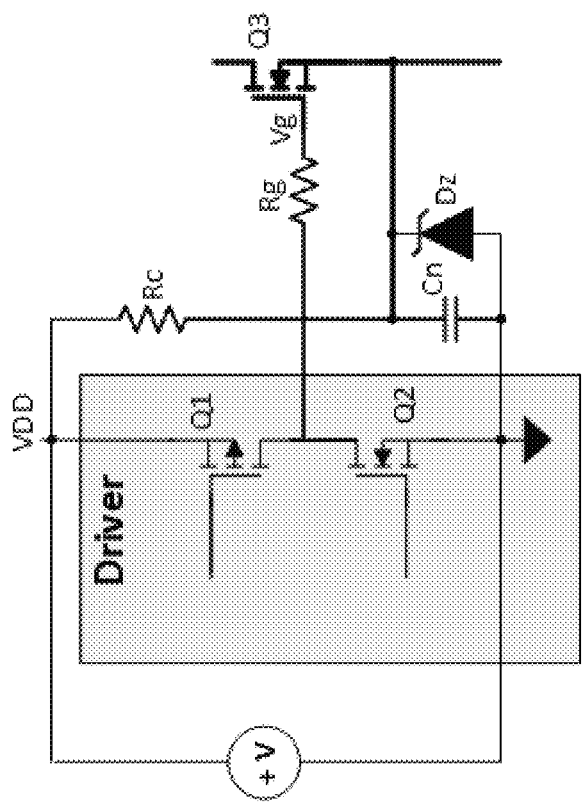
Figure 1C:
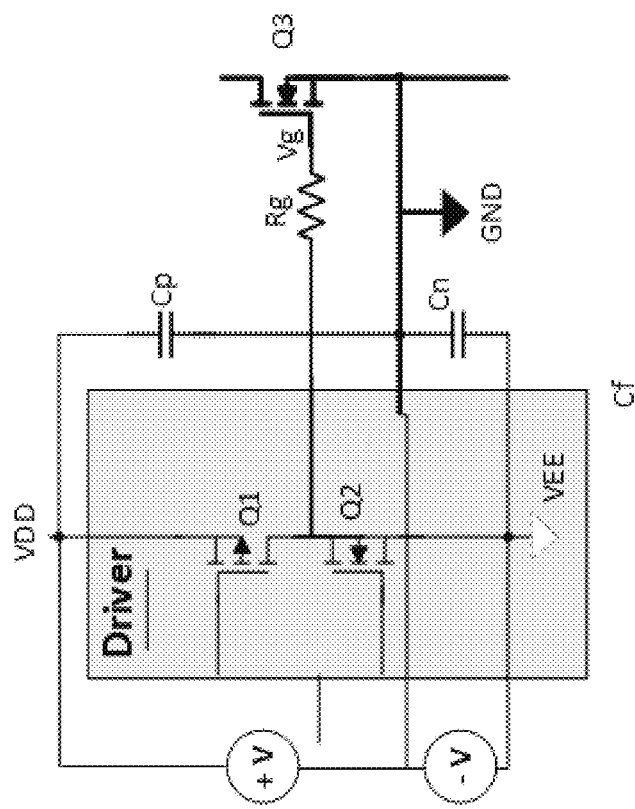
Figure 2:
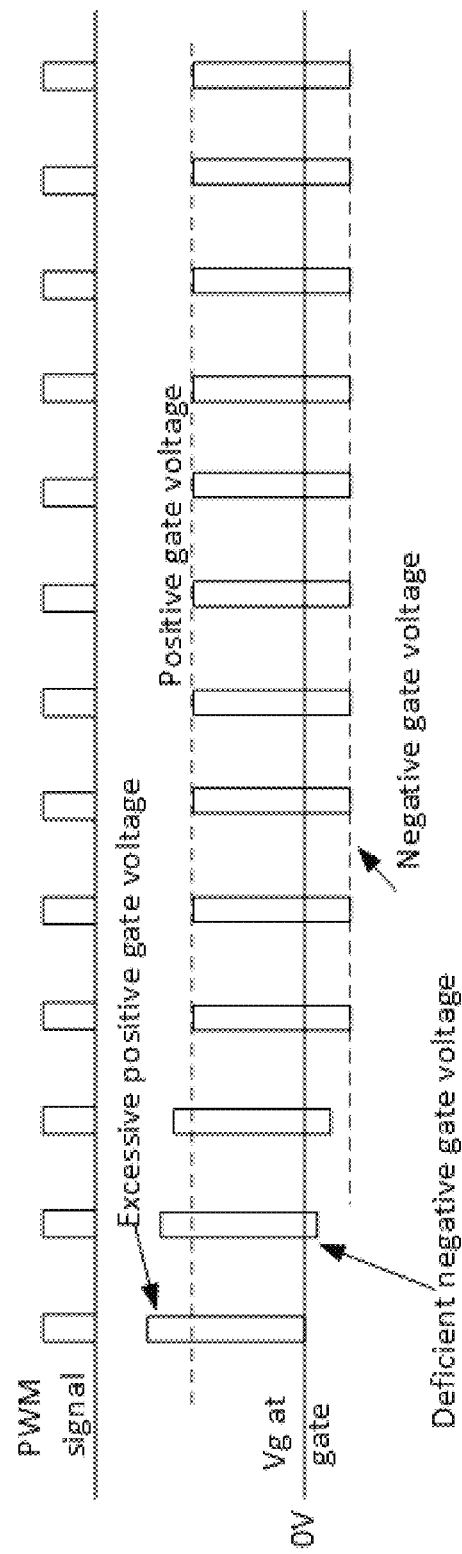
FIG. 2 is a timing diagram of the gate voltage in FIG. 1(a) as a function of the PWM signal.
Figure 3:
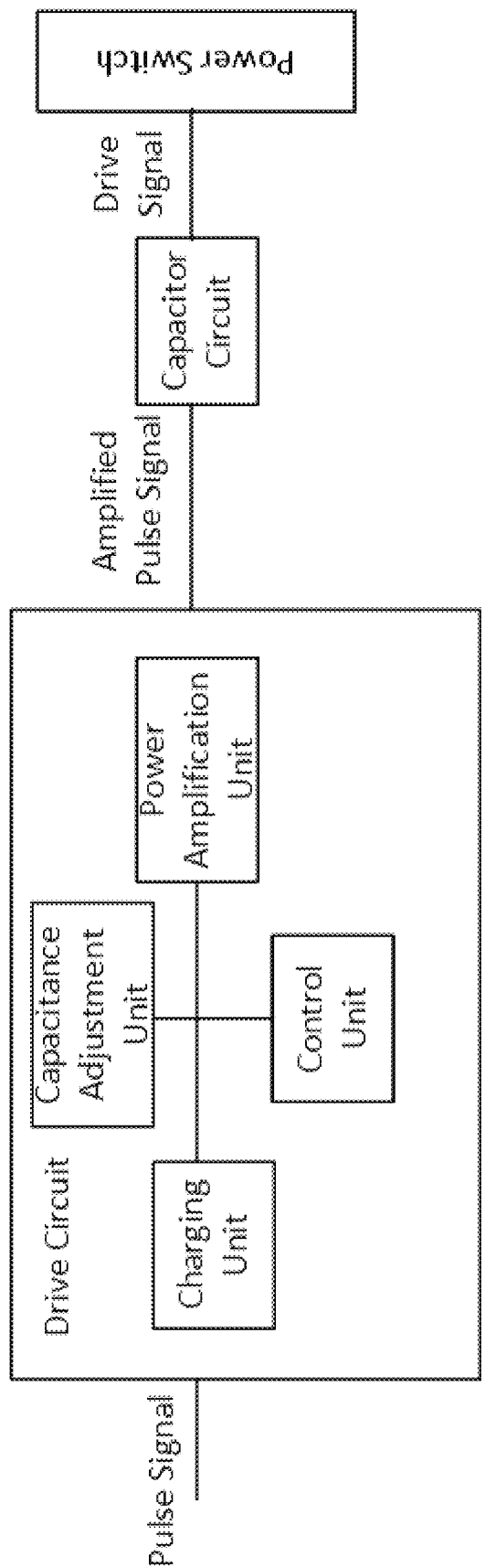
FIG. 3 is a block diagram of a power switch and its drive circuit according to an embodiment of the present invention.

The first embodiment of the present invention relates to a drive circuit of a power switch. FIG. 3 is a block diagram of the drive circuit.

Specifically, as shown in FIG. 3, the input terminal of the drive circuit receives a pulse signal. The pulse signal includes a turn-on signal and a turn-off signal for controlling the turn-on and turn-off of the power switch; the output terminal of the drive circuit is connected to the capacitor circuit. The capacitor circuit is used to provide a negative voltage applied to the first electrode of the power switch to turn off the power switch when the pulse signal is a turn-off signal. The drive circuit includes a capacitance adjustment unit, a charging unit, a power amplification unit, and a control unit.

Figure 4:
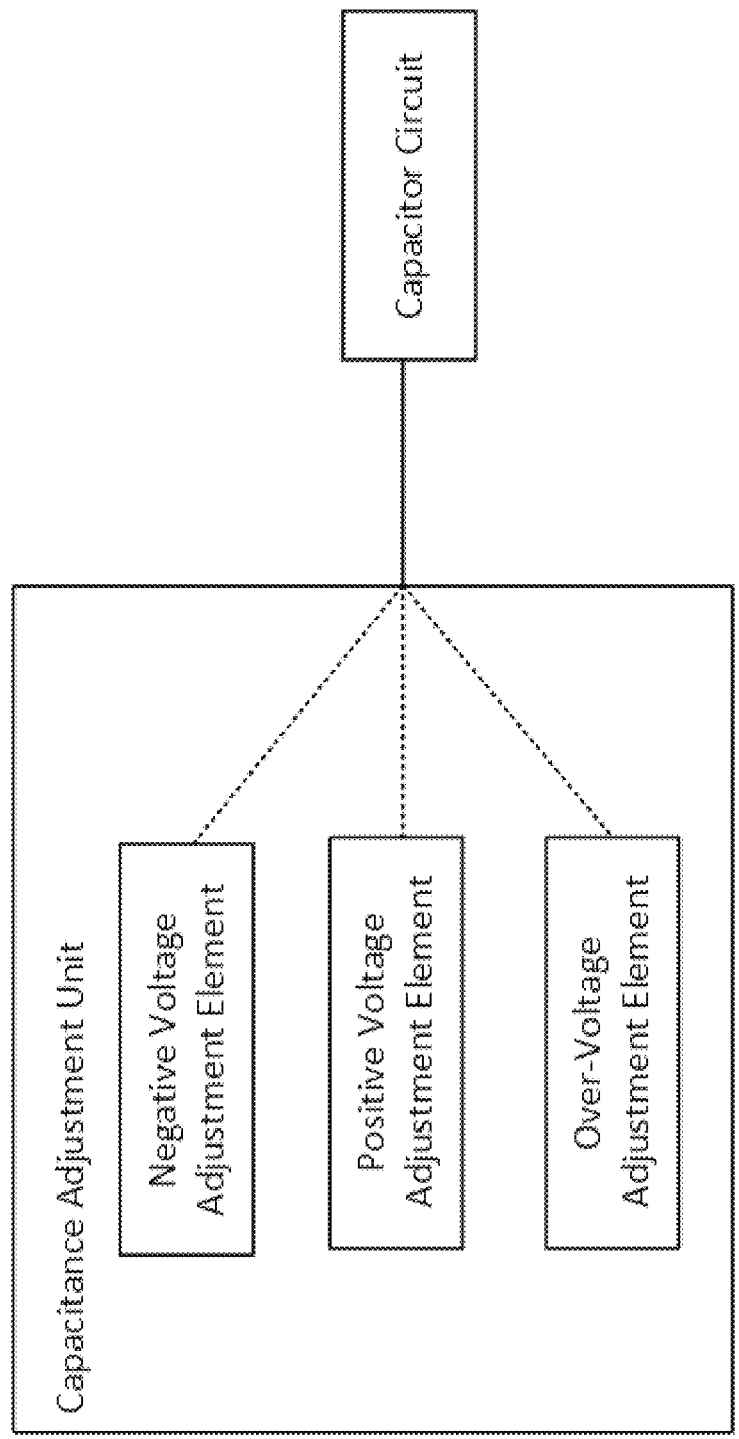
FIG. 4 is a block diagram of a capacitance adjustment unit according to an embodiment of the present invention.

FIG. 4 is a block diagram of the structure of the capacitance adjustment unit. As shown in FIG. 4, the capacitance adjustment unit includes a negative voltage adjustment element, a positive voltage adjustment element, and an over-voltage adjustment element. The negative voltage adjustment element can charge a capacitor whose voltage is lower than a predetermined voltage when the pulse signal is a turn-off signal. The capacitor is included in the capacitor circuit. Preferably, the negative voltage adjustment element includes a negative voltage charge pump for charging the capacitor whose voltage is lower than the predetermined voltage when the drive circuit receives the turn-off signal. The positive voltage adjustment element is used to charge the capacitor whose voltage is lower than the predetermined voltage when the drive circuit receives the turn-on signal. The over-voltage adjustment element is used to clamp the voltage of the capacitor to the predetermined voltage when the voltage of the capacitor exceeds the predetermined voltage. It can be understood that, in some exemplary embodiments of the present invention, the negative voltage charge pump can only charge a capacitor with a voltage lower than the predetermined voltage when the drive circuit receives a turn-off signal. Alternatively, the negative voltage charge pump can be set to charge the capacitor whose voltage is lower than the predetermined voltage when the drive circuit receives the turn-off signal, or the negative voltage charge pump can be set to charge the capacitor whose voltage is lower than the predetermined voltage when the drive circuit receives the turn-on signal.

The charging unit is used to charge the capacitor when the drive circuit is started. Preferably, in an exemplary embodiment, the charging unit includes a current source. The current source charges the capacitor when the drive circuit is activated. In another exemplary embodiment, the current source may be a voltage source with a current limitation, and the output voltage of the voltage source is the predetermined voltage of the capacitor.

The power amplifying unit is used to amplify the pulse signal received by the drive circuit and output it.

The control unit is used to turn off the power switch through the clamping circuit when the power supply voltage is lower than a first predetermined voltage and/or the voltage of the capacitor is lower than a second predetermined voltage.

Figure 5:
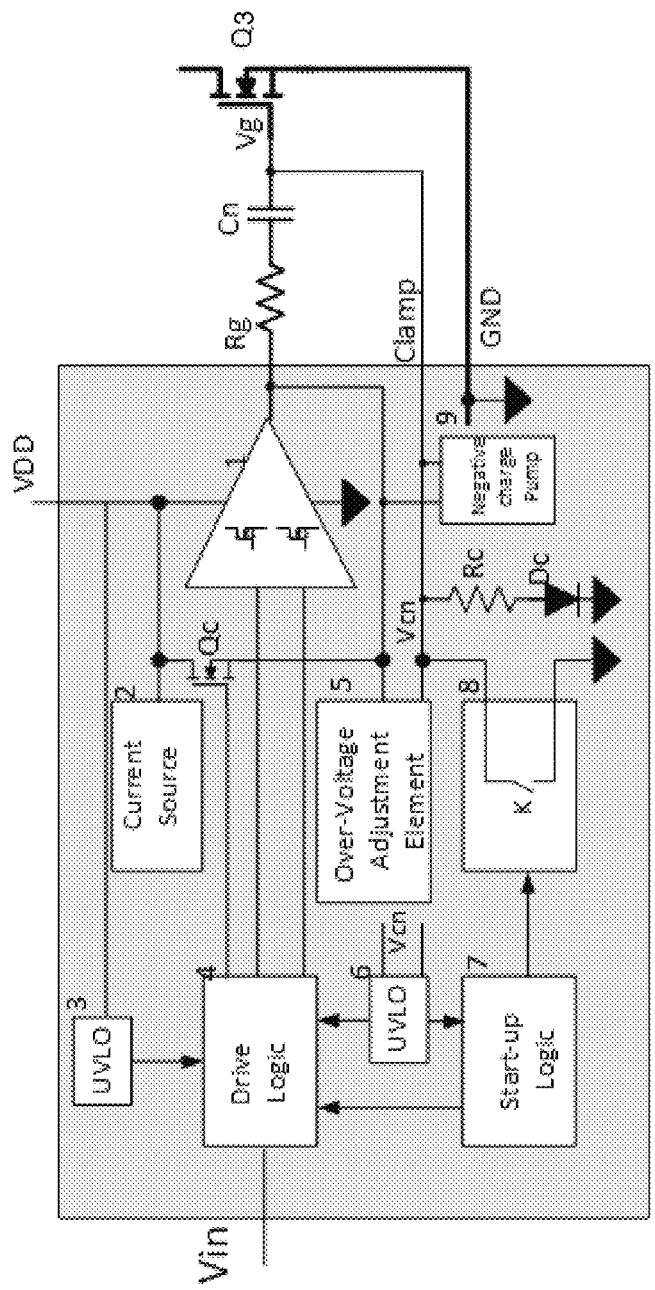
FIG. 5 is a schematic diagram of the circuit structure of a power switch and its drive circuit according to an embodiment of the present invention.

The embodiments above are the blocks of the circuit involved in the core idea of the present invention. In order to describe the technical solution of the present invention in more detail, FIG. 5 shows a schematic diagram of the circuit structure of the drive circuit of the power switch in an exemplary example. As shown in FIG. 5, the drive circuit includes a pulse signal input, a power amplifier unit 1, a current source 2, an under-voltage monitor UVLO 3 and an under-voltage monitor UVLO 6, a drive logic 4, an over-voltage adjustment element 5, a start logic unit 7, a second switch K 8, a negative voltage charge pump 9, a first resistor Rc, a diode Dc, a second resistor Rg, a capacitor Cn, and a first switch Qc. Moreover, in this example, the power transistor Q3 is an NMOS transistor, and its source is grounded. It can be understood that the type of power switch applicable to the drive circuit of the present invention is not limited to this, and may be other types of switches.

In this circuit, the negative voltage charge pump 9, the over-voltage adjustment element 5, the first resistor Rc and the diode Dc form a capacitance adjustment unit. Among them, the negative voltage charge pump 9 is used as a negative voltage adjustment element. The first resistor Rc and the diode Dc form a positive voltage adjustment element. The over-voltage adjustment element 5 preferably uses a Zener diode. The capacitor circuit comprises the capacitor Cn and the second resistor Rg. As shown in FIG. 5, the negative voltage charge pump 9 is connected in parallel with the capacitor Cn. The first terminal of the negative voltage charge pump 9 is connected to the low voltage end of the capacitor Cn, and the second terminal of the negative voltage charge pump 9 is connected to the second terminal of the second resistor Rg connected in series to the capacitor Cn. At the same time, the low voltage end of the capacitor Cn is connected to the gate of the power switch Q3, and the high voltage end of the capacitor Cn is connected to the first terminal of the second resistor Rg. The first terminal of the first resistor Rc is connected to the low voltage end of the capacitor Cn. The second terminal of the first resistor Rc is connected to the anode of the diode Dc. The cathode of the diode Dc is grounded. The over-voltage adjustment element 5 is connected in parallel with the capacitor Cn. One terminal of the over-voltage adjustment element 5 is connected to the low voltage end of the capacitor Cn, and the other end of the over-voltage adjustment element 5 is connected to the second end of the second resistor Rg, which is connected in series with the capacitor Cn. The second resistor Rg is used to limit the current of the pulse signal amplified by the power amplifying unit.

After receiving the pulse signal for turning off the power switch, if the voltage of the capacitor Cn decreases (for example, caused by leakage from a long time idle state or other interference factors), the negative voltage charge pump 9 can charge the capacitor Cn.

When the drive module receives the pulse signal that turns on the power switch, the first resistor Rc and the diode Dc can charge the capacitor. In other embodiments of the present invention, other existing circuits can also be used to charge the capacitor when the pulse signal is at a high level (that is, the pulse signal for turning on the power switch), which is not limited herein.

The over-voltage adjustment element 5 is used to reduce the voltage of the capacitor to the predetermined voltage when the voltage of the capacitor exceeds the predetermined voltage. Preferably, the over-voltage adjustment element includes a Zener diode. The over-voltage adjustment element can reduce the excessive charging current when the capacitor is charging.

In the circuit shown in FIG. 5, the current source 2, the first switch Qc, and the second switch K form a charging unit. The charging unit is used to charge the capacitor Cn with a current source included in the charging unit when the drive circuit is started, and when the charging unit charges Cn, the low voltage end of Cn and the source of Q3 are both grounded. The charging unit can quickly charge Cn when the drive circuit is started or restarted. In addition, since the capacitance adjustment unit can maintain the voltage of Cn, it can maintain the negative voltage required for the power switch to turn off without requiring an additional voltage source. At the same time, when Cn is charging, the gate and source of Q3 are grounded at the same time to ensure that Q3 remains off during the time of charging Cn, thereby improving the charging efficiency of Cn while ensuring the reliability of the circuit. Specifically, the current source 2, the first switch Qc, the second resistor Rg, the capacitor Cn, and the second switch K are sequentially connected in series. The first terminal of the second switch K is connected to the low voltage end of Cn, and the second terminal of the second switch K is grounded. When charging Cn, the first switch Qc and the second switch K are turned on, and the current source 2, the first switch Qc, the second resistor Rg, the capacitor Cn and the second switch K form a current path. This helps to achieve fast charging of the capacitor Cn.

In other embodiments of the present invention, other charging units may also be used to charge the capacitor Cn. For example, a charging unit including a voltage source can be used. The embodiments are not limited herein.

When the drive circuit is started or restarted, after the capacitor has been charged to the required predetermined voltage, a low-power negative voltage charge pump can be used to charge the capacitor in which leakage occurs. The low-power negative voltage charge pump helps to maintain the voltage of the capacitor at the predetermined voltage, thereby maintaining the negative voltage for a long time. At the same time, this method saves the circuit area and reduces the circuit cost. In addition, in other examples of the present invention, other existing charging circuits can also be used to charge Cn, which is not limited herein.

In addition, in the circuit shown in FIG. 5, the power amplifier unit 1 is used to achieve the power amplifying function. The power amplifier unit 1 is respectively connected to the drive logic 4 and the second resistor Rg. The power amplifier unit 1 is used to amplify the pulse signal received from the drive logic 4 and output it to the second resistor Rg, thereby controlling the on and off of Q3.

In the circuit shown in FIG. 5, the under-voltage monitor UVLO 3, the under-voltage monitor UVLO 6, the drive logic 4 and the start logic unit 7 form a control unit. The control unit is used for turning off the power switch through a clamping circuit when the power supply voltage is lower than a first predetermined voltage and/or the voltage of the capacitor circuit is lower than a second predetermined voltage. It should be understood that the second predetermined voltage here is much smaller than the predetermined voltage of the capacitor, such as the case where the capacitor circuit is short-circuited. Specifically, the under-voltage monitors 3 and 6 are connected to the drive logic 4 and the start logic unit 7. When the under-voltage monitors 3 and 6 detect that the power supply voltage VDD is lower than the first predetermined voltage and/or the voltage Vcn of the capacitor Cn is lower than the second predetermined voltage, the start logic unit 7 will output a signal to the drive logic 4. The drive logic 4 reduces the gate voltage of Q3 to zero by controlling the Miller clamp pin (e.g., the clamp circuit), thereby turning off Q3, which plays a role in circuit protection.

In addition, the control unit is also used to control the on and off of the first switch Qc and the second switch K in the above-mentioned charging unit to control whether the capacitor Cn is charged.

It can be understood that the control unit can also use other devices to implement its functions based on the prior art, which is not limited herein. In addition, in other embodiments of the present invention, other circuits can also be used to achieve the same function of the negative voltage pump here, which is not limited herein.

The operating principle of the circuit shown in FIG. 5 is as follows:

When the drive circuit is started or restarted, the capacitor Cn does not store charge. The control unit will control the first switch Qc and the second switch K transitioning from a turn-off state to a turn-on state. The current source 2, the first switch Qc, the second resistor Rg, the capacitor Cn and the second switch K form a current path to quickly charge the capacitor Cn. At the same time, the source and gate of Q3 are both grounded, and Q3 is cut off. During this period, if the charging voltage of Cn exceeds a predetermined voltage value, the over-voltage adjustment element will clamp it.

After the capacitor has been charged, when the pulse signal is a turn-on signal, the high-level turn-on signal is amplified by the power amplifying unit. The voltage at the high voltage terminal of Cn rises, and Q3 is turned on. During this period, if Cn leaks, the circuit comprising Rc and Dc can charge Cn which has a reduced voltage, and if the charging voltage of Cn exceeds the predetermined value, the over-voltage adjustment element will clamp it.

When the pulse signal module outputs a low-level turn-off signal such as zero volts, Cn provides a negative voltage to the gate of Q3, so that Q3 is turned off. During this period, if Cn leaks or other conditions cause the voltage of Cn to decrease, the negative voltage charge pump 9 will charge it.

In the above process, if the Cn voltage or VDD is extremely reduced (such as zero volts) caused by a short circuit of Cn or other reasons, the start logic unit 7 will output a signal to the drive logic 4, which will control Q3. The gate voltage of Q3 is reduced to zero for achieving circuit protection.

Figure 6:
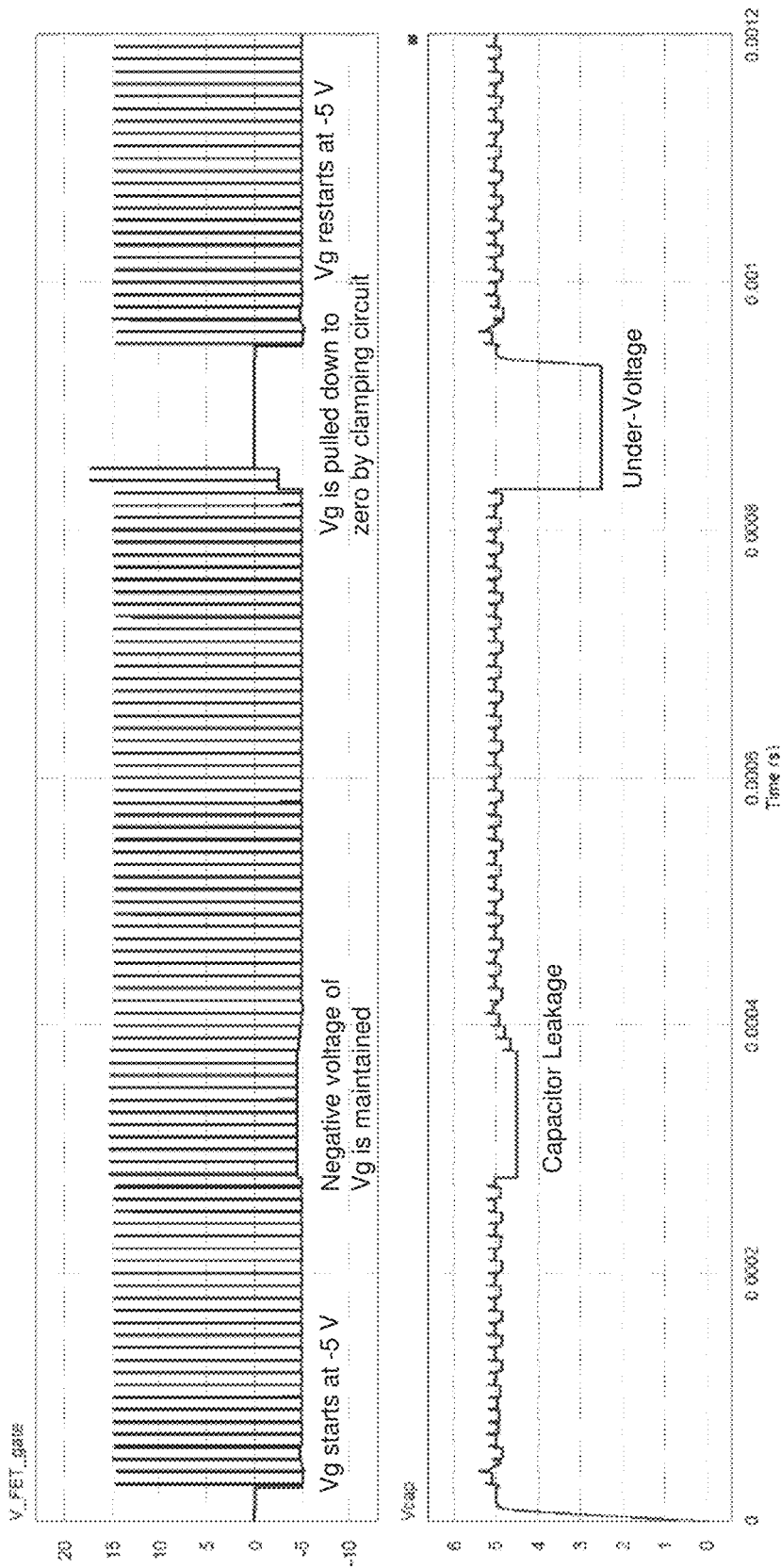
FIG. 6 is the simulation result of the gate voltage of the power switch in the circuit shown in FIG. 5.

FIG. 6 shows the simulation result of the circuit shown in FIG. 5. As can be seen from FIG. 6, when the capacitor leaks, the negative voltage at the gate of Q3 is maintained, that is, the voltage is maintained at the predetermined voltage. When an under-voltage condition occurs (that is, VDD or Vcn is severely reduced), Vg is pulled down to the ground voltage.

The invention does not require an additional power source, and can timely supplement the voltage loss caused by leakage or slight interference to the capacitor when the pulse signal is a turn-off signal for a long time, such as an idle time, so as to provide a stable turn-off negative voltage for the power switch.

In practical applications, the above-mentioned drive circuit may be a separate integrated circuit or a non-integrated circuit, which is not limited herein.

It can be understood that in other exemplary embodiments of the present invention, the circuit shown in FIG. 5 may not include the first resistor Rc and the diode Dc, and the negative voltage charge pump 9 charges the capacitor Cn when the pulse signal is an on signal.

The second embodiment of the present invention relates to a drive device including the drive circuit of the first embodiment and the capacitor circuit.

The third embodiment of the present invention relates to a drive device including the drive circuit of the first embodiment, a capacitor circuit, and a pulse circuit that generates a pulse signal.

It should be noted that in the claims and specification of this patent, relational terms such as first and second are only used to distinguish one entity or operation from another entity or operation, and do not necessarily require or imply that there is any such actual relationship or order between these entities or operations. Moreover, the terms "include", "comprise" or any other variants thereof are intended to cover non-exclusive inclusion, so that a process, method, article, or device including a series of elements. It includes not only those elements, but also includes other elements. It also includes elements inherent to this process, method, article or equipment. If there are no more restrictions, the element defined by the phrase "comprising one" does not exclude the existence of other same elements in the process, method, article, or equipment including the element.

Figure 7:
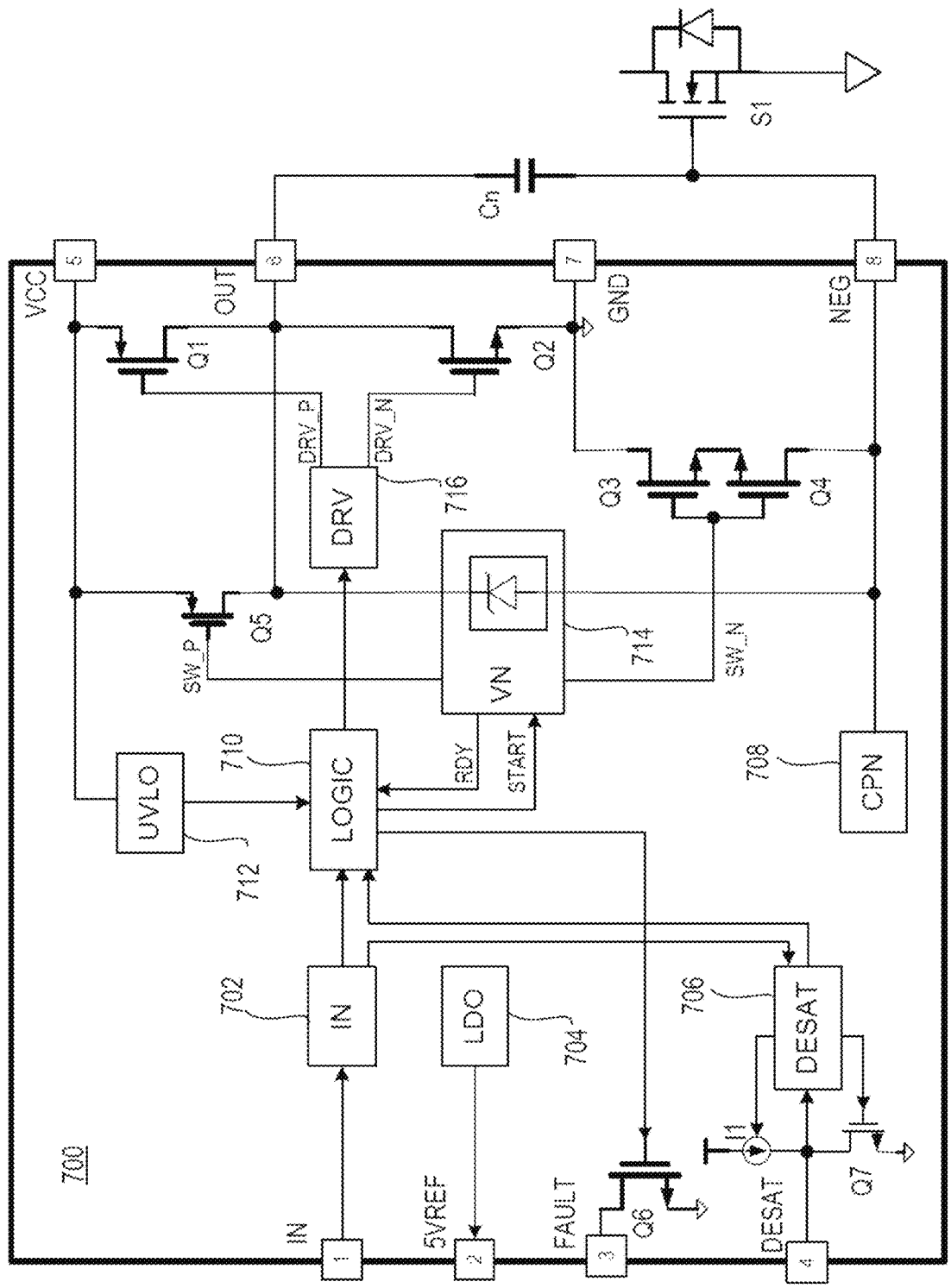
FIG. 7 is a block diagram of a drive circuit in accordance to various embodiments of the present disclosure.

FIG. 7 is a block diagram of a drive circuit in accordance to various embodiments of the present disclosure. The drive circuit 700 shown in FIG. 7 is employed to drive a power switch S1. The drive circuit 700 is coupled to the power switch S1 through a capacitor Cn. It should be noted that the configuration shown in FIG. 7 is merely an example. Depending on different applications, the configuration shown in FIG. 7 may vary. For example, a resistor may be placed between the capacitor Cn and the gate of the power switch S1. Throughout the description, the drive circuit 700 may be alternatively referred to as a driver. It should be noted that the configuration shown in FIG. 7 is selected purely for demonstration purposes and are not intended to limit the various embodiments of the present disclosure to any particular configuration. For example, depending on different applications and design needs, other necessary components such as resistors may be coupled between the capacitor and the gate of the power switch S1.

As shown in FIG. 7, the drive circuit 700 comprises an input buffer 702, a low-dropout (LDO) linear regulator 704, a desaturation detection (DESAT) circuit 706, a negative voltage adjustment device 708, a logic circuit 710, an under voltage lockout (UVLO) circuit 712, a startup control circuit 714, a drive signal generator 716, switches Q1, Q2, Q3, Q4, Q5, Q6, Q7, and a current source Ii. The drive circuit 700 includes eight input/output terminals, namely an input (IN) terminal, a reference (5VREF) terminal, a fault (FAULT) terminal, a desaturation detection (DESAT) terminal, a bias (VCC) terminal, an output (OUT) terminal, a ground (GND) terminal and a negative voltage (NEG) terminal.

The input terminal is configured to receive logic input signals. The logic input signals may be a plurality of pulses for controlling the operation of the power switch S1. The reference terminal is configured to provide a voltage reference (e.g., 5 V) for external circuits. As shown in FIG. 7, the voltage reference is generated by the LDO 704.

The fault terminal is an open collector fault output. The fault terminal is pulled to low by the switch Q6 when a fault such as over current, short circuit or UVLO is detected. The DESAT terminal is a desaturation input. The desaturation input is employed to determine whether a short circuit or over current happens. The bias terminal is connected to a positive bias supply. The output terminal is the gate driver output. The output terminal is coupled to the gate of S1 through the capacitor Cn or the capacitor Cn and a resistor. The ground terminal is the ground of the driver. The NEG terminal is a negative voltage output.

As shown in FIG. 7, the capacitor Cn is coupled between a control terminal (e.g., gate) of the power switch and the output terminal of the driver 700. As shown in FIG. 7, the capacitor Cn is connected between terminals OUT and NEG. The NEG terminal is connected to the control terminal of the power switch. In some embodiments, the capacitance of the capacitor Cn is about 1 uF.

In some embodiments, the power switch S1 is selected from the group consisting of a silicon carbide (SiC) metal oxide semiconductor field effect transistor (MOSFET), a silicon MOSFET or an insulated-gate bipolar transistor (IGBT).

As shown in FIG. 7, the logic circuit 710 is configured to receive a logic input signal (e.g., a pulse signal) through the input buffer 702. In addition, the logic circuit 710 is configured to receive a plurality of operating parameters. As shown in FIG. 7, the plurality of operating parameters includes an output signal generated by the UVLO circuit 712, an output signal generated by the DESAT circuit 706 and a ready signal RDY generated by the startup control circuit 714. In response to a fault such as an under voltage lockout, the logic circuit 710 reports a fault at the fault terminal through switch Q6.

In normal operation, prior to a startup process of the driver 700, the logic circuit 710 is configured to generate a startup signal. The startup signal is fed into the startup control circuit 714. In response to the startup signal, the startup control circuit 714 is configured to generate control signals SW_P and SW_N for the startup charging circuit. The startup charging circuit comprises a first auxiliary switch Q5 and a second auxiliary switch. The second auxiliary switch comprises two back-to-back connected transistors Q3 and Q4. As shown in FIG. 7, the first auxiliary switch Q5, the capacitor Cn and the second auxiliary switch (Q3 and Q4) are connected in series between the bias terminal VCC and the ground terminal GND. During the startup process, the startup charging circuit is configured to provide a current to charge the capacitor Cn. The detailed structure and operation of the startup charging circuit will be described below with respect to FIG. 8.

It should be noted that during the startup process, the driver 700 disregards the input logic signal. After the startup process finishes, the driver 700 starts to follow the input logic signal.

In normal operation, upon receiving the input logic signal, the logic circuit 710 is configured to generate a control signal. As shown in FIG. 7, the control signal is fed into drive signal generator 716. The drive signal generator 716 is configured to generate DRV_P and DRV_N based on the control signal. As shown in FIG. 7, DRV_P is applied to the gate of Q1. DRV_N is applied to the gate of Q2. Switches Q1 and Q2 are connected in series between VCC and GND.

Q1 and Q2 form an output stage of the driver 700. The output stage is employed to further improve the driving strength of the driver 700.

In normal operation, in some embodiments, the negative voltage adjustment device 708 is always on. The negative voltage adjustment device 708 is configured to charge the capacitor Cn. In other words, both the negative voltage adjustment device 708 and the startup charging circuit charge the capacitor Cn simultaneously during the startup process. In alternative embodiments, the negative voltage adjustment device 708 may not operate during the startup process. Once the startup process finishes, the startup control circuit 714 generates the ready signal. In response to this ready signal, the negative voltage adjustment device 708 is configured to charge the capacitor Cn. As shown in FIG. 7, the negative voltage adjustment device 708 is connected to a common node of the capacitor Cn and the gate of the power switch S1. In operation, the negative voltage adjustment device 708 is configured such that after a turn-off signal is applied to the gate of the power switch S1, the capacitor Cn is charged by the negative voltage adjustment device 708 to a predetermined voltage level. More particularly, the voltage of the capacitor Cn is maintained at a predetermined negative voltage level by a Zener diode (e.g., Zener diode 802 shown in FIG. 8 or Zener diode equivalent circuitry such as a shunt regulator or other suitable clamping circuitry). The negative voltage adjustment device 708 functions as a current source. This current source provides a bias current for the Zener diode. In some embodiments, the capacitor Cn is configured to provide a negative voltage applied to the gate of the power switch S1 in response to the turn-off signal applied to the gate of the power switch S1.

In some embodiments, the negative voltage adjustment device 708 is a negative voltage charge pump. The detailed structure and operation of the negative voltage charge pump will be described below with respect to FIG. 9.

It should be noted that the Zener diode in the startup control circuit 714 regulates the negative voltage across the capacitor Cn to a predetermined voltage (e.g., −3.5 V). As a result of having this predetermined voltage across the capacitor Cn, the gate drive signal switches between a sum of VCC and the predetermined voltage (e.g., VCC−3.5 V) and the predetermined voltage (e.g., −3.5 V).

Figure 8:
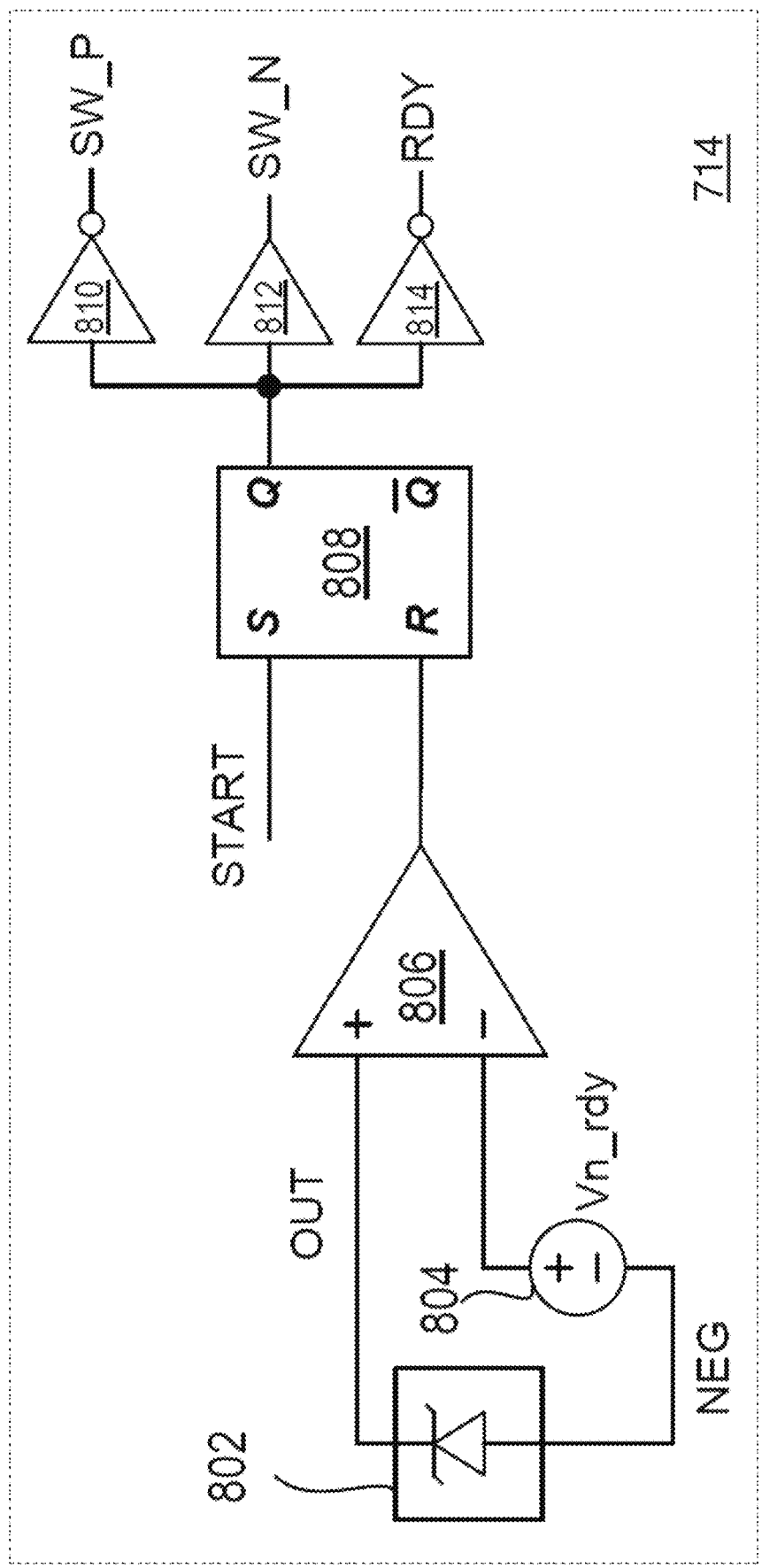
FIG. 8 is a block diagram of the startup control circuit in accordance to various embodiments of the present disclosure.

FIG. 8 is a block diagram of the startup control circuit in accordance to various embodiments of the present disclosure. The startup control circuit 714 comprises a sensing device 802, a predetermined reference Vn_rdy, a comparator 806, a flip-flop latch 808, a first inverter 810, a buffer 812 and a second inverter 814. As shown in FIG. 8, the sensing device 802 is a Zener diode. Throughout the description, the sensing device 802 may be alternatively referred to as a Zener diode. It should be noted that the sensing device 802 can be any Zener diode equivalent circuitry such as a shunt regulator or other suitable clamping circuitry.

In some embodiments, the Zener diode 802 is connected in parallel with the capacitor Cn. The voltage across the Zener diode 802 is representative of the voltage across the capacitor Cn. In other words, the Zener diode 802 is configured to sense a voltage across the capacitor Cn. A non-inverting input of the comparator 806 is connected to the Zener diode 802. An inverting input of the comparator 806 is connected to the predetermined reference Vn_rdy. A set input of the flip-flop latch 808 is configured to receive the start signal generated by the logic circuit 710. A reset input of the flip-flop latch 808 is connected to the output of the comparator 806. The first inverter 810 has an input connected to an output of the flip-flop latch, and an output configured to generate a first gate drive signal SW_P for the startup charging circuit. The buffer 812 has an input connected to the output of the flip-flop latch 808, and an output configured to generate a second gate drive signal SW_N for the startup charging circuit. The second inverter 814 has an input connected to the output of the flip-flop latch 808, and an output configured to generate the ready signal RDY.

In operation, during a startup process of the driver, the startup control circuit is configured to generate control signals (SW_P and SW_N) for the startup charging circuit. The startup charging circuit is configured to charge the capacitor Cn. During the startup process of the driver, the voltage across the capacitor Cn is compared with the predetermined reference Vn_rdy. Once the voltage across the capacitor exceeds the predetermined reference Vn_rdy, the startup control circuit is configured to generate the ready signal RDY. Upon receiving the ready signal, the negative voltage adjustment device 708 shown in FIG. 7 is configured to charge the capacitor Cn. In alternative embodiments, the negative voltage adjustment device 708 is configured to operate before the ready signal RDY is available. Both the negative voltage adjustment device 708 and the startup charging circuit charge the capacitor Cn simultaneously during the startup process.

Figure 9:
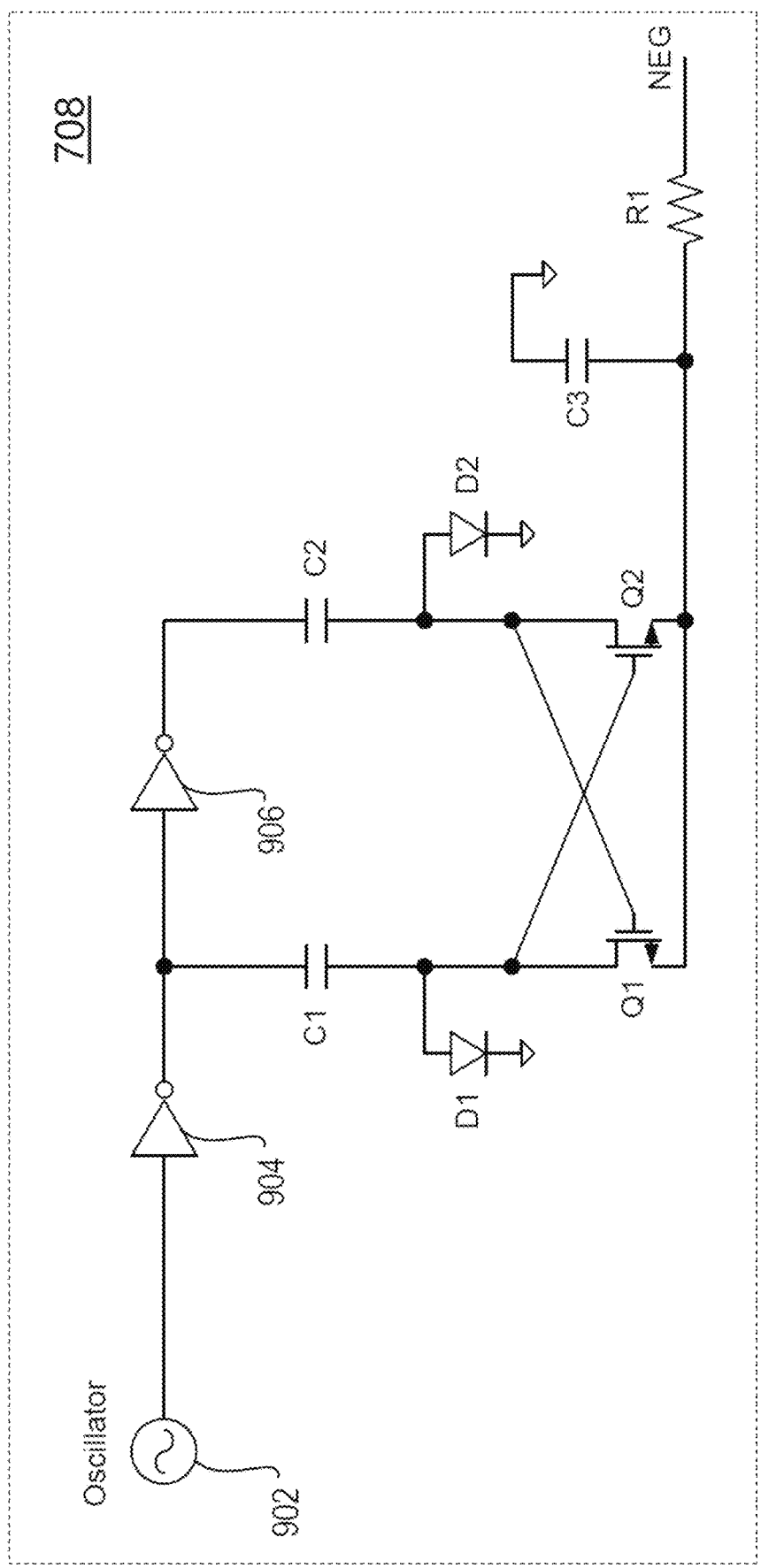
FIG. 9 is a block diagram of the negative voltage charge pump in accordance to various embodiments of the present disclosure.
Figure 10:
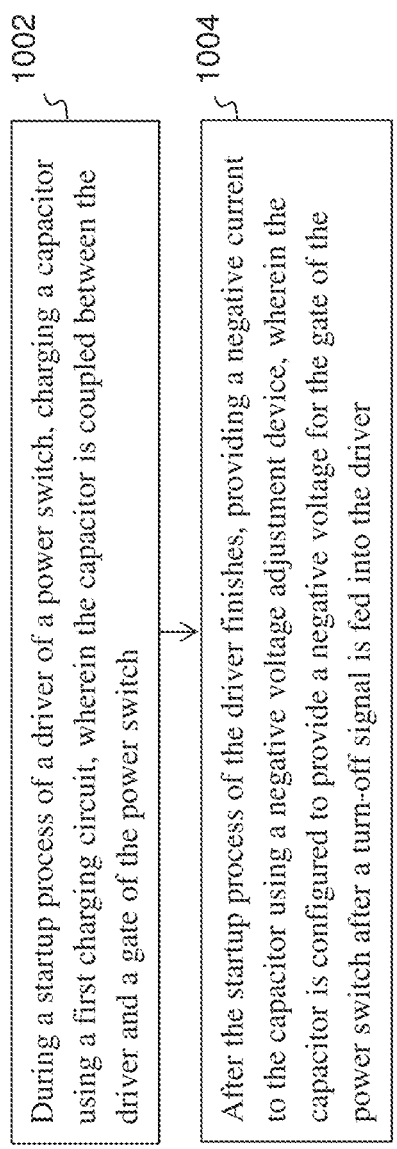
FIG. 10 illustrates a flow chart of controlling the driver shown in FIG. 7 in accordance with various embodiments of the present disclosure.

FIG. 9 is a block diagram of the negative voltage charge pump in accordance to various embodiments of the present disclosure. The negative voltage charge pump comprises an oscillator 902, a first inverter 904, a second inverter 906, a first capacitor C1, a second capacitor C2, a first diode D1, a second diode D2, a first switch Q1, a second switch Q2 and a filter. The filter is formed by a resistor R1 and a third capacitor C3.

As shown in FIG. 9, an input of the first inverter 904 is connected to an output of the oscillator 902. An input of the second inverter 906 is connected to an output of the first inverter 904. The first capacitor C1 and the first diode D1 are connected in series between the input of the second inverter 906 and ground. The second capacitor C2 and the second diode D2 are connected in series between the output of the second inverter 906 and ground. The first switch Q1 is connected between a common node of the first capacitor C1 and the first diode D1, and an input of the filter. The second switch Q2 is connected between a common node of the second capacitor C2 and the second diode D2, and the input of the filter. A gate of the first switch Q1 is connected to a common node of the second diode D2 and the second switch Q2. A gate of the second switch Q2 is connected to a common node of the first diode D1 and the first switch Q1. An output of the filter is connected to the common node of the capacitor Cn and the gate of the power switch S1.

In operation, the negative voltage charge pump is configured to generate a negative voltage on the common node of Q1 and Q2. Through the resistor R1, this negative voltage is converted into a corresponding negative current. This negative current is applied to the capacitor Cn through the Zener diode 802 shown in FIG. 8. As a result, a negative voltage is established across the capacitor Cn. Such a negative voltage across Cn helps to establish a negative voltage on the gate of the power switch in response to the turn-off signal applied to the gate of the power switch.

FIG. to illustrates a flow chart of controlling the driver shown in FIG. 7 in accordance with various embodiments of the present disclosure. This flowchart shown in FIG. to is merely an example, which should not unduly limit the scope of the claims. One of ordinary skill in the art would recognize many variations, alternatives, and modifications. For example, various steps illustrated in FIG. 12 may be added, removed, replaced, rearranged and repeated.

At step 1002, during a startup process of a driver (e.g., driver 700 shown in FIG. 7) of a power switch (e.g., power switch S1 shown in FIG. 7), a first charging circuit (e.g., the startup charging circuit formed by switches Q3, Q4 and Q5 shown in FIG. 7) is configured to charge a capacitor (e.g., Cn). The capacitor Cn is coupled between the driver and a gate of the power switch.

At step 1004, after the startup process of the driver finishes, a negative voltage adjustment device (e.g., negative voltage charge pump 708 shown in FIG. 9) is configured to provide a negative current for the capacitor. The capacitor is configured to provide a negative voltage for the gate of the power switch after a turn-off signal is fed into the driver.

The method further comprises during the startup process, comparing a voltage across the capacitor with a predetermined reference, and generating a ready signal once the voltage across the capacitor exceeds the predetermined reference.

The negative voltage adjustment device is a negative voltage charge pump.

The negative voltage charge pump comprises an oscillator, a first inverter, a second inverter, a first capacitor, a second capacitor, a first diode, a second diode, a first switch, a second switch and a filter. An input of the first inverter is connected to an output of the oscillator. An input of the second inverter is connected to an output of the first inverter. The first capacitor and the first diode are connected in series between the input of the second inverter and ground. The second capacitor and the second diode are connected in series between the output of the second inverter and ground. The first switch is connected between a common node of the first capacitor and the first diode, and an input of the filter. The second switch is connected between a common node of the second capacitor and the second diode, and the input of the filter, and wherein a gate of the first switch is connected to a common node of the second diode and the second switch, and a gate of the second switch is connected to a common node of the first diode and the first switch. An output of the filter is connected to the common node of the capacitor and the gate of the power switch.

Figure 11:
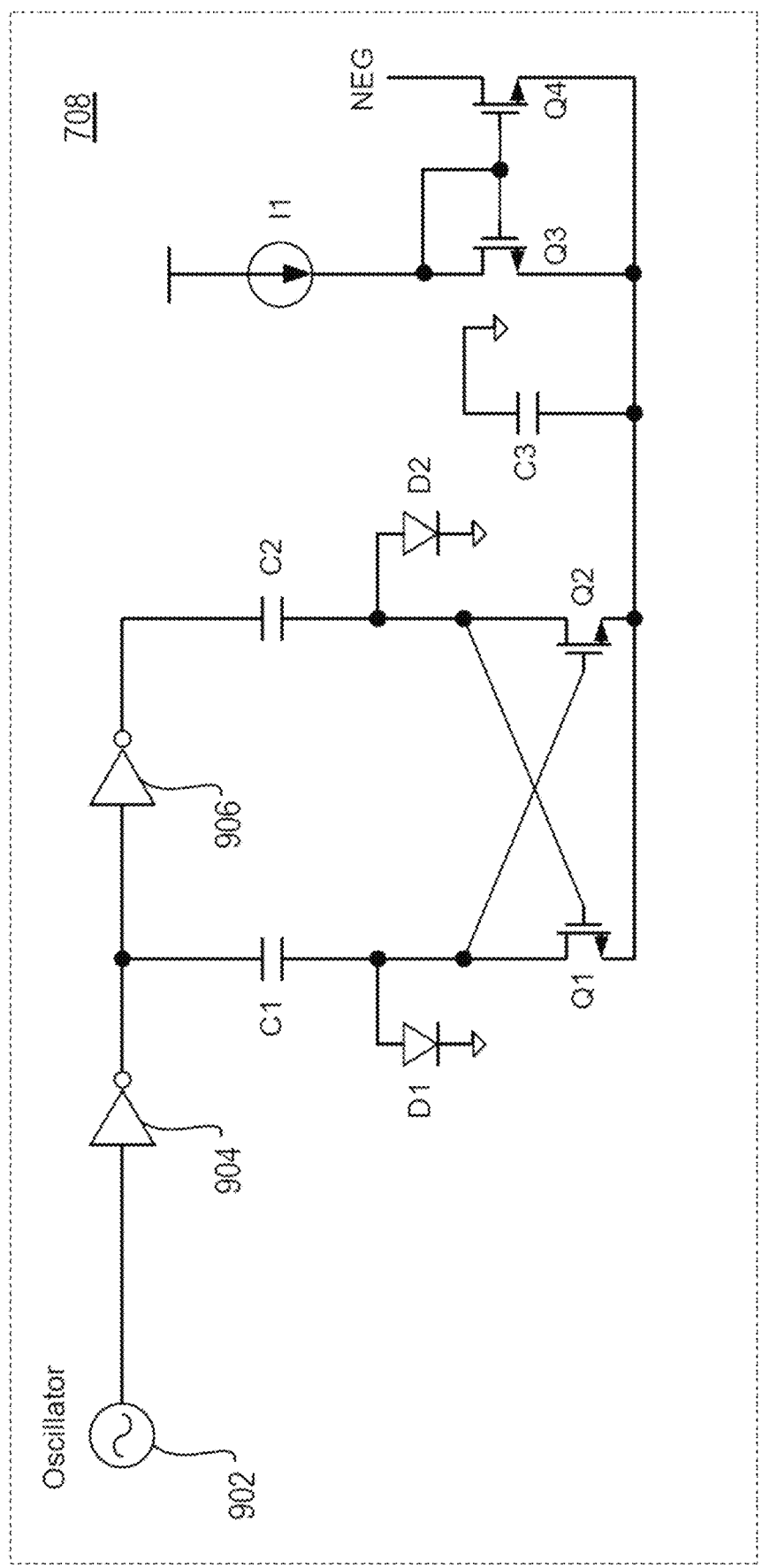
FIG. 11 is a block diagram of a different implementation of the negative voltage charge pump in accordance to various embodiments of the present disclosure.

FIG. 11 is a block diagram of a different implementation of the negative voltage charge pump in accordance to various embodiments of the present disclosure. The negative voltage charge pump shown in FIG. 11 is similar to that shown in FIG. 9 except that the resistor R1 is replaced by a current source Ii and a current mirror formed by Q3 and Q4. The operation principle of the current mirror is well known in the art, and hence is not discussed herein to avoid repetition.

One advantageous feature of having the negative voltage charge pump shown in FIG. 11 is the current mirror and the current source can accurately control the current flowing through the NEG terminal shown in FIG. 11, thereby improving the performance of the drive circuit.

In accordance with an embodiment, an apparatus comprises a capacitor coupled to a gate of a power switch, and a negative voltage adjustment device connected to a common node of the capacitor and the gate of the power switch, wherein the negative voltage adjustment device is configured such that after a turn-off signal is applied to the gate of the power switch, a voltage across the capacitor is maintained at a predetermined voltage level through a negative current provided by the negative voltage adjustment device.

In accordance with an embodiment, a method comprises during a startup process of a driver of a power switch, charging a capacitor using a first charging circuit, wherein the capacitor is coupled between the driver and a gate of the power switch, and after the startup process of the driver finishes, providing a negative current to the capacitor using a negative voltage adjustment device, wherein the capacitor is configured to provide a negative voltage for the gate of the power switch after a turn-off signal is fed into the driver.

In accordance with an embodiment, a system comprises a power switch, a capacitor coupled between a control terminal of the power switch and an output of a gate drive circuit, a logic circuit configured to receive a logic input signal and a plurality of operating parameters, and generate a control signal applied to the control terminal of the power switch through the gate drive circuit and the capacitor, a negative voltage adjustment device connected to the capacitor, a startup capacitor charging circuit configured to charge the capacitor during a startup process of the system, and a startup control circuit configured to receive a start signal, generate gate drive signals for a startup charging circuit, and output a ready signal once a startup process of the system finishes.

Although the present invention has been illustrated and described by referring to certain preferred embodiments of the present invention, those of ordinary skill in the art should understand that various changes can be made in form and details without departing from the spirit and scope of the present invention.

Although embodiments of the present disclosure have been described in detail, it should be understood that various changes, substitutions and alterations can be made herein without departing from the spirit and scope of the disclosure as defined by the appended claims. Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. An apparatus comprising:
   a capacitor coupled to a gate of a power switch and a startup charging circuit, wherein the startup charging circuit comprises a first auxiliary switch and a second auxiliary switch, and wherein the first auxiliary switch, the capacitor and the second auxiliary switch are connected in series between a bias voltage source and ground; and
   a negative voltage adjustment device coupled to the capacitor and the gate of the power switch, wherein the negative voltage adjustment device is configured such that after a turn-off signal is applied to the gate of the power switch, a voltage across the capacitor is maintained at a predetermined voltage level through a negative current provided by the negative voltage adjustment device.

2. The apparatus of claim 1, wherein:
   the negative voltage adjustment device is a negative voltage charge pump.

3. The apparatus of claim 2, wherein:
   the negative voltage charge pump comprises an oscillator, a first inverter, a second inverter, a first capacitor, a second capacitor, a first diode, a second diode, a first switch, a second switch and a filter, and wherein:
   an input of the first inverter is connected to an output of the oscillator;
   an input of the second inverter is connected to an output of the first inverter;
   the first capacitor and the first diode are connected in series between the input of the second inverter and ground;
   the second capacitor and the second diode are connected in series between the output of the second inverter and ground;
   the first switch is connected between a common node of the first capacitor and the first diode, and an input of the filter;
   the second switch is connected between a common node of the second capacitor and the second diode, and the input of the filter, and wherein a gate of the first switch is connected to a common node of the second diode and the second switch, and a gate of the second switch is connected to a common node of the first diode and the first switch; and
   an output of the filter is connected to the common node of the capacitor and the gate of the power switch.

4. The apparatus of claim 1, wherein:
   the power switch is selected from the group consisting of a silicon carbide (SiC) metal oxide semiconductor field effect transistor (MOSFET), a silicon MOSFET or an insulated-gate bipolar transistor (IGBT).

5. The apparatus of claim 1, wherein:
   the startup charging circuit is configured to charge the capacitor during a startup process of the apparatus, and wherein after the startup process finishes, the negative voltage adjustment device is configured to provide the negative current to maintain the voltage across the capacitor.

6. The apparatus of claim 1, wherein:
   the second auxiliary switch comprises two back-to-back connected transistors.

7. The apparatus of claim 1, wherein:
   the capacitor is configured to provide a negative voltage to the gate of the power switch, and wherein as a result of having the negative voltage, a gate voltage of the power switch varies from a sum of a bias voltage and the negative voltage to the negative voltage.

8. The apparatus of claim 1, further comprising:
   a startup control circuit configured to receive a start signal, generate gate drive signals for a startup charging circuit, and output a ready signal once a startup process of the apparatus finishes.

9. The apparatus of claim 8, wherein:
   the startup control circuit comprises a sensing device configured to sense a voltage across the capacitor, a predetermined reference, a comparator, a flip-flop latch, a first inverter, a buffer and a second inverter, and wherein:
   the sensing device is connected in parallel with the capacitor;
   a non-inverting input of the comparator is connected to the sensing device;
   an inverting input of the comparator is connected to the predetermined reference;
   a set input of the flip-flop latch is configured to receive the start signal;
   a reset input of the flip-flop latch is connected to the output of the comparator;

the first inverter has an input connected to an output of the flip-flop latch, and an output configured to generate a first gate drive signal for the startup charging circuit;

the buffer has an input connected to the output of the flip-flop latch, and an output configured to generate a second gate drive signal for the startup charging circuit; and the second inverter has an input connected to the output of the flip-flop latch, and an output configured to generate the ready signal.

10. A method comprising:

during a startup process of a driver of a power switch, charging a capacitor using a first charging circuit, wherein the capacitor is coupled between the driver and a gate of the power switch, and wherein the first charging circuit comprises a first auxiliary switch and a second auxiliary switch, and wherein the first auxiliary switch, the capacitor and the second auxiliary switch are connected in series between a bias voltage source and ground; and after the startup process of the driver finishes, providing a negative current to the capacitor using a negative voltage adjustment device, wherein the capacitor is configured to provide a negative voltage for the gate of the power switch after a turn-off signal is fed into the driver.

11. The method of claim 10, wherein:
the second auxiliary switch comprises two back-to-back connected transistors.

12. The method of claim 10, further comprising:
during the startup process, comparing a voltage across the capacitor with a predetermined reference, and generating a ready signal once the voltage across the capacitor exceeds the predetermined reference.

13. The method of claim 10, wherein:
the negative voltage adjustment device is a negative voltage charge pump.

14. The method of claim 13, wherein:
the negative voltage charge pump comprises an oscillator, a first inverter, a second inverter, a first capacitor, a second capacitor, a first diode, a second diode, a first switch, a second switch and a filter, and wherein:
an input of the first inverter is connected to an output of the oscillator;
an input of the second inverter is connected to an output of the first inverter;
the first capacitor and the first diode are connected in series between the input of the second inverter and ground;
the second capacitor and the second diode are connected in series between the output of the second inverter and ground;
the first switch is connected between a common node of the first capacitor and the first diode, and an input of the filter;
the second switch is connected between a common node of the second capacitor and the second diode, and the input of the filter, and wherein a gate of the first switch is connected to a common node of the second diode and the second switch, and a gate of the second switch is connected to a common node of the first diode and the first switch; and
an output of the filter is connected to the common node of the capacitor and the gate of the power switch.

15. A system comprising:
a power switch;
a capacitor coupled between a control terminal of the power switch and an output of a gate drive circuit;
a logic circuit configured to receive a logic input signal and a plurality of operating parameters, and generate a control signal applied to the control terminal of the power switch through the gate drive circuit and the capacitor;
a negative voltage adjustment device connected to the capacitor;
a startup capacitor charging circuit configured to charge the capacitor during a startup process of the system; and
a startup control circuit configured to receive a start signal, generate gate drive signals for a startup charging circuit, and output a ready signal once a startup process of the system finishes.

16. The system of claim 15, wherein:
the negative voltage adjustment device is configured such that after a turn-off signal is applied to the control terminal of the power switch, a voltage across the capacitor is maintained at a predetermined voltage level through a negative current provided by the negative voltage adjustment device.

17. The system of claim 15, wherein:
the negative voltage adjustment device is a negative voltage charge pump; and
the gate drive circuit comprises a high-side switch and a low-side switch connected in series between a bias voltage source and ground, and wherein a common node of the high-side switch and the low-side switch is the output of the gate drive circuit.

18. The system of claim 15, wherein:
the startup charging circuit comprises a first auxiliary switch and a second auxiliary switch, and wherein the first auxiliary switch, the capacitor and the second auxiliary switch are connected in series between a bias voltage source and ground, and wherein the second auxiliary switch comprises two back-to-back connected transistors.

19. The system of claim 15, wherein:
the startup control circuit comprises a sensing device configured to sense a voltage across the capacitor, a predetermined reference, a comparator, a flip-flop latch, a first inverter, a buffer and a second inverter, and wherein:
the sensing device is connected in parallel with the capacitor;
a non-inverting input of the comparator is connected to the sensing device;
an inverting input of the comparator is connected to the predetermined reference;
a set input of the flip-flop latch is configured to receive the start signal;
a reset input of the flip-flop latch is connected to the output of the comparator;
the first inverter has an input connected to an output of the flip-flop latch, and an output configured to generate a first gate drive signal for the startup charging circuit;
the buffer has an input connected to the output of the flip-flop latch, and an output configured to generate a second gate drive signal for the startup charging circuit; and
the second inverter has an input connected to the output of the flip-flop latch, and an output configured to generate the ready signal.

\* \* \* \* \*